United States Patent
Alcoe et al.

(10) Patent No.: US 6,740,959 B2
(45) Date of Patent: May 25, 2004

(54) EMI SHIELDING FOR SEMICONDUCTOR CHIP CARRIERS

(75) Inventors: David James Alcoe, Vestal, NY (US); Jeffrey Thomas Coffin, Pleasant Valley, NY (US); Michael Anthony Gaynes, Vestal, NY (US); Harvey Charles Hamel, Poughkeepsie, NY (US); Mario J. Interrante, New Paltz, NY (US); Brenda Lee Peterson, Wappingers Falls, NY (US); Megan J. Shannon, Wappingers Falls, NY (US); William Edward Sablinski, Beacon, NY (US); Christopher Todd Spring, Wappingers Falls, NY (US); Randall Joseph Stutzman, Vestal, NY (US); Renee L. Weisman, Poughkeepsie, NY (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/921,062

(22) Filed: Aug. 1, 2001

(65) Prior Publication Data

US 2003/0025180 A1 Feb. 6, 2003

(51) Int. Cl.⁷ .................. H01L 23/552; H01L 39/00
(52) U.S. Cl. .................. 257/659; 257/660; 257/661; 257/662
(58) Field of Search .................. 257/659, 660, 257/661–662, 663

(56) References Cited

U.S. PATENT DOCUMENTS

| | | | |
|---|---|---|---|
| 4,323,155 A | 4/1982 | Kling | 206/328 |
| 4,967,315 A | 10/1990 | Schelhorn | 361/424 |
| 5,043,534 A | 8/1991 | Mahulikar et al. | 174/52.4 |
| 5,133,495 A * | 7/1992 | Angulas et al. | 228/180.1 |
| 5,227,583 A | 7/1993 | Jones | 174/52.4 |
| 5,254,871 A | 10/1993 | Benavides et al. | 257/666 |
| 5,313,371 A | 5/1994 | Knecht et al. | 361/818 |
| 5,317,107 A | 5/1994 | Osorio | 174/52.4 |
| 5,371,408 A | 12/1994 | Moulton et al. | 257/730 |
| 5,436,203 A | 7/1995 | Lin | 437/209 |
| 5,477,421 A | 12/1995 | Bethurum | 361/818 |
| 5,485,037 A | 1/1996 | Marrs | 257/712 |
| 5,536,907 A | 7/1996 | Miyawaki et al. | 174/52.4 |
| 5,635,754 A | 6/1997 | Strobel et al. | 257/659 |
| 5,650,659 A | 7/1997 | Mostafazadeh et al. | 257/660 |
| 5,761,053 A | 6/1998 | King et al. | 361/818 |
| 5,838,093 A | 11/1998 | Sakai et al. | 310/348 |
| 5,838,551 A | 11/1998 | Chan | 361/818 |
| 5,866,943 A | 2/1999 | Mertol | 257/712 |
| 5,882,729 A | 3/1999 | Kahl et al. | 427/265 |
| 5,898,344 A | 4/1999 | Hayashi | 331/67 |
| 5,939,772 A | 8/1999 | Hurst et al. | 257/659 |
| 5,939,784 A | 8/1999 | Glenn | 257/710 |
| 5,986,340 A | 11/1999 | Mostafazadeh et al. | 257/713 |
| 6,020,637 A * | 2/2000 | Karnezos | 257/738 |
| 6,051,888 A | 4/2000 | Dahl | 257/778 |
| 6,061,251 A | 5/2000 | Hutchison et al. | 361/820 |
| 6,084,297 A | 7/2000 | Brooks et al. | 257/698 |
| 6,163,456 A * | 12/2000 | Suzuki et al. | 361/704 |
| 6,355,978 B1 * | 3/2002 | Watanabe | 257/700 |
| 6,359,341 B1 * | 3/2002 | Huang et al. | 257/778 |
| 6,404,049 B1 * | 6/2002 | Shibamoto et al. | 257/712 |
| 6,407,334 B1 * | 6/2002 | Jimarez et al. | 174/52.4 |

FOREIGN PATENT DOCUMENTS

| | | | |
|---|---|---|---|
| EP | 806 981 A | | 11/1997 |
| JP | 08097336 A | * | 4/1996 |
| JP | 11097568 A | * | 4/1999 |

* cited by examiner

Primary Examiner—Bradley Baumeister
Assistant Examiner—Chris C Chu
(74) Attorney, Agent, or Firm—Scully, Scott, Murphy & Presser; William H. Steinberg, Esq

(57) ABSTRACT

Electronic packages incorporating EMI shielding, and particularly semiconductor devices which incorporate semiconductor chip-carrier structures having grounded bands embedded therein which are adapted to reduce outgoing and incident EMI emissions for high-speed switching electronic packages.

28 Claims, 1 Drawing Sheet

EMI SHIELDING FOR SEMICONDUCTOR CHIP CARRIERS

BACKGROUND OF THE INVENTION

1. Field of the Invention

Figure 1:
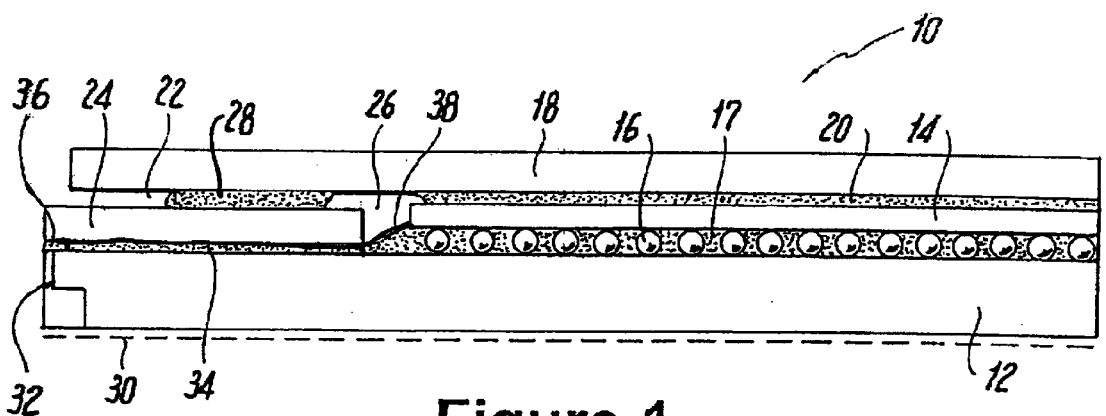

The present invention relates to electronic packages incorporating EMI shielding. More particularly, the invention relates to semiconductor devices which incorporate integrated circuit chip-carrier structures having grounded shields embedded therein and which are adapted to reduce EMI emissions for high-speed switching electronic packages.

In carrying out the production of electronic packages, particularly such as semiconductor devices which incorporate chip carriers or substrates of either laminates or organic materials or ceramics and the like, and which support one or more semiconductor chips which are covered by a heat-dissipating lid or cap structure, the reliable functioning thereof is potentially adversely affected due to encountered electromagnetic interference (EMI), requiring that an EMI shield be provided to counteract and eliminate the adverse effects thereof. Moreover, the EMI shielding is intended to also function as an emission shield; in effect, to inhibit or stop outgoing EMI energy. Quite frequently, such semiconductor devices may comprise a substrate providing for electrical connections to one or more semiconductor chips positioned thereon, and whereby a heat-dissipating structure; for instance, such as a heat spreader in the form of a cap or lid is, in turn, arranged above the chip or chips and in thermally-conductive mechanical adhesive connection therewith.

Various electrical components and interconnects are normally provided on both sides of the substrates in electrical communication with the chip or chips, as is well known in the semiconductor or electronic packaging technology. In order to effectively screen out any encountered EMI during operation of the semiconductor devices, it has been proposed to provide structure extending about the chip and interposed between the heat-dissipating lid structure or cap, and also the substrate, in that suitable connections or wiring is to be provided, thereby creating an EMI shield for the semiconductor device or electronic package. In this connection, numerous types of EMI shields or similar types of EMI protective structures for the electronic packages or semiconductor devices have been proposed in the technology, possessing varying degrees of efficacy in protecting or shielding the devices from electromagnetic interference (EMI).

2. Discussion of the Prior Art

Accordingly, among numerous publications in this particular field of the technology which is directed to the provision of EMI shielding for electronic packages, such as semiconductor devices, Mertol U.S. Pat. No. 5,866,943 discloses a system and method for forming a grid array device package employing electromagnetic shielding, in which a stiffener is disposed intermediate a substrate and a lid or cap structure having a semiconductor chip interposed therebetween. The stiffener which encompasses the semiconductor chip includes various electrical interconnections between the semiconductor chip, substrate and the heat spreader or cover so as to, in effect, provide for the necessary EMI shield to protect against the effects of EMI during operation of the electronic package.

Mostafazadeh et at. U.S. Pat. No. 5,650,659 discloses a semiconductor component package assembly, which includes an EMI shield interposed between a substrate and a heat dissipating structure, and encompassing an integrated circuit chip to provide for electrical connections forming an integral radio frequencies/electromechanical interference (RF/EMI) shield. In one particular embodiment, an adhesive of an electrically conductive nature may be interposed between the substrate and the structure forming the EMI shield as necessary to provide for the electrical grounding of the component.

King et al. U.S. Pat. No. 5,761,053 also discloses a Faraday cage in which a cover positioned on a substrate and encompassing integrated circuit components enables the energy of EMI/RFI to be dissipated so as to render the effects thereof harmless to the operation of the device.

Similarly, Osorio U.S. Pat. No. 5,317,107 discloses a semiconductor device including a substrate and a cover portion having an integrated circuit chip interposed therebetween, and including shielding to block EMI energy which would have an adverse effect on the functioning of the device.

In addition to the foregoing publications, numerous other patents are in existence which are directed to providing EMI shielding to various electronic structures of the most diverse types.

Hutchison et al. U.S. Pat. No. 6,261,251 discloses a wirebond package for low cost (radio frequency) applications utilizing a complex metal-lead frame structure to provide for isolation from disruptive frequencies.

Glenn U.S. Pat. No. 5,939,784 discloses a package for a wirebond die employed in a acoustical wave device, and which possess an EMI shielded surface.

Hurst et al. U.S. Pat. No. 5,939,772 discloses a wirebond package incorporating metal plates in a surrounding configuration which are adapted to impart magnetic shielding to the package.

Sakai et al. U.S. Pat. No. 5,838,093 discloses a piezoelectric element package incorporating a device with a surrounding metal cup which provides shielding from EMI energy during functioning of the package.

Miyawaki et al. U.S. Pat. No. 5,536,907 discloses a wirebond package for a semiconductor device including a metal lid incorporated therein and structure providing for EMI shielding.

Benavides et al. U.S. Pat. No. 5,254,871 provides for a tape automatic bonding (TAB) carrier including an incorporated or integrated heatsink and metal plate construction which enables functioning thereof as an EMI shielding.

Jones U.S. Pat. No. 5,227,583 discloses a wirebond package having a ceramic lid which is metallized as a signal shielding component protective from the energy generated by EMI.

Furthermore, Schelhorn U.S. Pat. No. 4,967,315; Kling U.S. Pat. No. 4,323,155; Hayashi U.S. Pat. No. 5,898,344; Strobel et al. U.S. Pat. No. 5,635,754; Marrs U.S. Pat. No. 5,485,037; Bethurum U.S. Pat. No. 5,477,421; Moulton, et al. U.S. Pat. No. 5,371,408; Knecht, et al. U.S. Pat. No. 5,313,371; and Mahulikar et al. U.S. Pat. No. 5,043,534 each, to some extent, describe various types of structures in the shape of either electronic packages or semiconductor devices which incorporate EMI shielding arrangements so as to inhibit the effects of EMI on the performance of the various devices or electronic packages.

Although the foregoing publications are each to varying degrees directed to the incorporation of EMI shielding, the present invention is concerned with the advantageous configurations of grounded-lid or electronic packages which are particularly suitably adapted for extremely high-speed electronic switching applications, such as for Hyper BGAs', (reg. ™) and which require a highly efficient type of EMI shielding.

SUMMARY OF THE INVENTION

Accordingly, pursuant to one embodiment of the invention there is provided a semiconductor device comprising an organic substrate or chip carrier, wherein a lid of a electrically and thermally-conductive structure is attached to a stiffener which is interposed between the perimetrical regions of the substrate and the lid, and wherein an integrated circuit or semiconductor chip is positioned between the lid and the organic substrate, while encompassing the stiffener, and includes an adhesive between the chip and substrate which is of a compliant, thermally conductive nature so as to promote a good thermo-mechanical connection of good reliability between the components. Arranged embedded in the organic carrier is an electrically conductive ground band so as to extend around the perimeter portion of the carrier and between the top and bottom surfaces of the substrate. The stiffener may be attached to the substrate by means of an electrically non-conductive adhesive material so as to cover the active circuitized area on the chip carrier or substrate extending about the integrated circuit chip, and with an electrically-conductive adhesive material extending over the ground band which is embedded in the substrate.

Pursuant to a second embodiment of the invention, the chip carrier or substrate may comprise a rigid ceramic element mounting a ball grid array (BGA), which element interconnected to a chip through the intermediary of solder balls which may be embedded in an underfill. An electrically and thermally-conductive lid, such as a heat-dissipating cap structure is superimposed on the chip and is connected thereto by means of a suitable dielectric adhesive. A conductive ground band is formed proximate the perimeter in the ceramic substrate so as to be embedded therein, and with an EMI gasket of electrically conductive nature interconnecting the ground with the heat-dissipating lid or cap structure. The ground ring component forms a grounded connection with the ball grid array to produce an EMI shield for the entire arrangement.

Pursuant to a third embodiment of the invention, which is generally similar to the second embodiment as mentioned hereinabove, the lid or cap structure may have a depending annular flange portion which electrically communicates with the embedded wiring forming the ground band in the perimeter area of the ceramic substrate by means of an EMI adhesive, whereas in the preceding embodiment, rather than an adhesive there is employed an EMI gasket.

The rigid or inherently stiff nature of the substrates utilized in the second and third embodiments, such as the ceramic chip carrier, eliminates the need for the provision of a stiffener structure as is required in connection with the less rigid organic substrate or laminated chip carrier of the first embodiment.

Accordingly, it is an object of the present invention to provide a novel electronic package arrangement incorporating EMI shielding comprising a stiffener positioned intermediate a substrate of an organic nature and an electrically conductive lid or heat dissipating cap between which there is arranged an integrated circuit chip encompassed by the stiffener, and wherein the substrate is provided with ground connections for producing an EMI shield, with a ground ring being embedded in the perimetrical region of the organic substrate.

A further object of the present invention resides in the provision of an electronic package of the type described comprising an EMI barrier to incident or incoming EMI energy.

A still further object of the present invention resides in the provision of an electronic package of the type described herein comprising an EMI shield for outgoing or emitted EMI energy.

Pursuant to a further object of the present invention there is provided an arrangement which imparts EMI shielding to a semiconductor package the type of described wherein an EMI gasket is interposed between a ceramic substrate having band-shaped grounding wires imbedded proximate the perimeter thereof, and providing for electrical interconnections with a metallic lid or heat-dissipating cap structure and with a ball grid array on the substrate.

Yet another object of the present invention is to provide an electronic package or semiconductor structure which includes an EMI adhesive interposed between an annular depending flange on a heat-dissipating lid or cap, and electrically conductive wiring embedded in a ceramic substrate and connected to a ball grid array so as to form a grounding connection with the metallic lid, so as to produce an EMI shield for the structure.

Moreover, another object of the invention resides in a method of utilizing the EMI shielding as installed in an electronic package as described herein.

BRIEF DESCRIPTION OF THE ACCOMPANYING DRAWINGS

Figure 2:
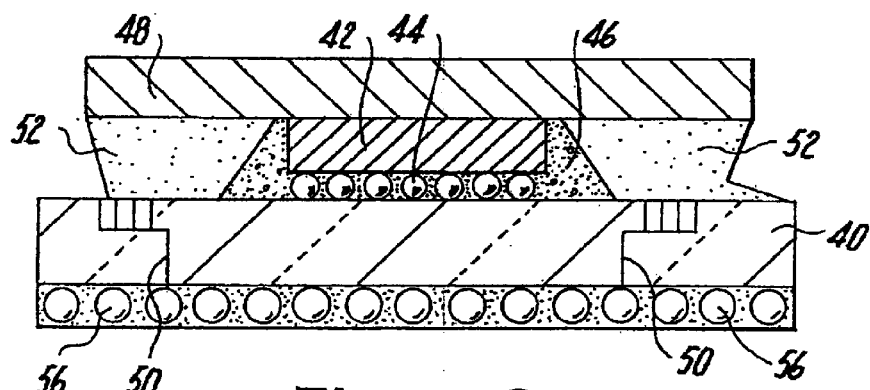
Figure 3:
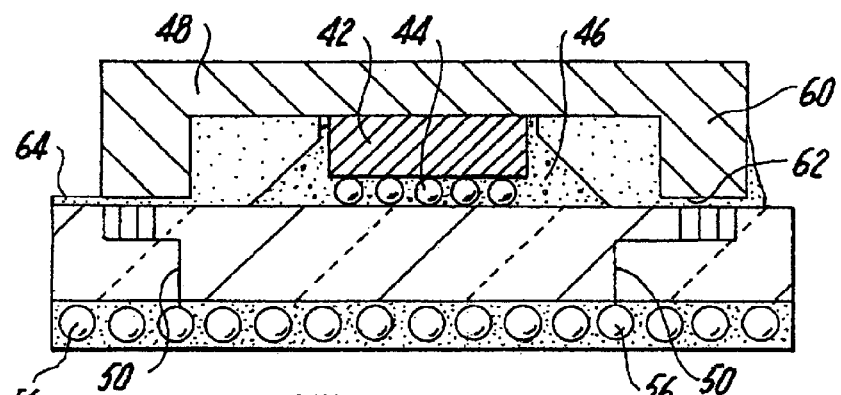

Reference may now be made to the following detailed description of preferred embodiments of electronic packages or semiconductor devices equipped with EMI shielding, taken in conjunction with the accompanying drawings; in which:

FIG. 1 illustrates generally diagrammatically, a first embodiment in a partial cross-sectional representation of a semiconductor package, including an organic substrate and a stiffener structure employed in forming a grounded EMI shield;

FIG. 2 illustrates a second embodiment of a package with a ceramic substrate including an embedded ground ring electrically communicating with a lid through an EMI gasket to form an EMI shield in a semiconductor package; and FIG. 3 illustrates a third embodiment of a semiconductor package similar to the second embodiment but utilizing an EMI adhesive rather than a gasket interposed between electrical ground wires extending perimetrically within a ceramic substrate and a conductive cap or lid.

DETAILED DESCRIPTION OF PREFERRED EMBODIMENTS

Referring in more specific detail to the drawings, and particularly to the embodiment as illustrated in FIG. 1, there is diagrammatically represented a semiconductor package 10 comprising an organic substrate 12, which may be constituted of a laminate, and wherein an integrated circuit chip 14 is shown positioned thereon. Interposed between the chip 14 and the substrate 12 are suitable solder balls 16, as is well known in the technology, and which may be encapsulated in an underfill material 17.

Arranged above the chip 14, opposite the side facing the substrate 12, and extending radially outwardly of the chip 14 is a lid or heat-dissipating cap structure 18 of an electrically-conductive material, for instance, such as but not limited to copper, aluminum, tin, chromium, silicon, carbide, carbon, diamond, ceramic with electrically-conductive coatings, alloys and compositions thereof, and the like, as are well known in the technology, which is attached to the chip by means of a thermally-conductive compliant adhesive 20 in order to promote good thermo-mechanical reliability in their interconnection, the adhesive being essentially of an electrically non-conductive or low-conductive nature in composition, such as being a silver-filled adhesive which is both thermally and electrically-conductive.

Positioned to extend along a peripheral region 22 intermediate the lower surface of the lid or cap structure 18 and the upper surface of the organic substrate 12 is a stiffener member 24 which, in its plane, may be essentially of a box-shaped configuration with a central opening 26 extending in spaced relationship about the peripheral extent of the chip 14. The stiffener member 24 may be of a suitable electrically-conductive material, similar to the lid or heat-dissipating cap 18, by being constituted of the materials as set forth hereinabove, of both metallic and non-metallic compositions. The lid or cap structure 18 is fastened to the stiffener 24 through the interposition of an electrically-conductive adhesive 28, whereas in contrast, the adhesive between the chip and lid is normally a compliant thermally conductive and electrically non-conductive adhesive. Alternatively, the adhesive 28 may be electrically non-conductive but provided with internal conductive elements to form an electrical path between the stiffener 24, lid 18 and the substrate 12.

As indicated, pursuant to invention, the opposite side of the organic substrate 12 may include electrical connections to the solder balls 16, such as for example, such as a circuit path to array a BGA 30, only schematically indicated, and which form electrical interconnections with the chip 14, as is well known in the technology.

The area along the perimeter of the organic substrate 12 includes embedded therein a ring-shaped electrical ground band 32 extending between the top surface of the organic substrate and the connections 30 at the opposite surface thereof. The attachment of the stiffener 24 to the lid or cap 18, as indicated previously, is an electrically conductive adhesive material, and on the opposite side of the stiffener facing the substrate, an electrically-nonconductive adhesive 34, such as pyrolux, which covers the active circuitized area on the substrate, and a further electrically conductive adhesive material 36 extending over the ground band 32 on the upper surface of the organic substrate 12 so as to form an electrical connection with the stiffener 24, whereas the ground band at the lower surface of the substrate electrically contacts the ball grid array 30. The internal electrical circuitization on the substrate upper surface has a connection 38 formed with the ground band 32 and one or more solder balls 16 on the perimeter of the module, thereby resultingly creating an electromagnetic interference (EMI) shield for the entire semiconductor package 10, shield against outgoing EMI energy and also forming a barrier to incoming or incident EMI energy.

Although, in essence the basic concept of providing EMI shields for various types of devices is known in the technology, it is the specific and advantageous arrangement of the ground ring 32 embedded within the organic substrate 12 in communication with the stiffener 24, which in this embodiment creates a superior and unique EMI shield which is particularly effective for the very high speed switching applications of semiconductor devices which are currently being contemplated in the technology.

Referring now to the embodiment of FIG. 2 of the drawings, in this instance, the stiffener utilized in the embodiment of FIG. 1 has been eliminated, inasmuch as herein a substrate 40 is comprised of a rigid ceramic material, and consequently does not necessitate the use of a stiffener member; the stiffness being inherently provided by the properties of ceramic material.

As in the previous embodiment, an integrated circuit chip 42 is arranged on an upper surface of the ceramic substrate 40, with the interposition of solder balls 44 which are embedded in an underfill material 46. A lid or heat-dissipating cap structure 48 which extends radially outwardly of the peripheral confines of the integrated circuit chip 42, and which is constituted of an electrically-conductive material, such as has been described in connection with lid or cap structure is, in electrical communication with a ground band 50 consisting of wires embedded within the peripheral region of the substrate 40 and extending between the opposite surfaces thereof. An EMI gasket 52 presenting an electrically-conductive path is interposed between the lid 48 and the upper wire ends of the ground band 50, the latter of which is embedded within the substrate and is located along the perimeter of the latter, whereby the gasket 52 may be adhered to either the lid or the ground band. The lower end of the ground band 50 is in electrically grounding connection with a ball grid array 56 on the surface of the substrate distal to the chip, and further electrical connections can be provided with the chip through one or more of the solder balls and the adhesive extending between the lid and the ground band wire ends at the upper surface of the substrate 40.

With regard to the embodiment of FIG. 3 of the drawings, which is substantially similar to that of FIG. 2, in this instance, the electrically-conductive cap or lid structure 48 is equipped with a depending peripheral flange 60 having a lower end surface 62 in close proximity with the upper surface of the ceramic substrate 40. Hereby, in lieu of the gasket 52 of adhesive material of FIG. 2 extending between the lower surface of the lid and the upper wire ends of the peripherally embedded ground band 50, there is utilized an electrically conductive EMI adhesive 64 which also communicates with at least one of the solder balls 44 and integrated circuit on the chip so as to form an EMI shield structure similar to that in the embodiments of FIGS. 1 and 2.

The foregoing constructions including the novel ground bands which are embedded in the perimetrical region of the substrates 12,40 of the various embodiments, provide a highly effective EMI shield or barrier surrounding the entire package or semiconductor structure, thereby reducing or even completely eliminating any outgoing EMI emissions and incoming EMI energy encountered during the operation of the modules. While the invention has been particularly shown and described with respect to preferred embodiments thereof, it will be understood by those skilled in the art that the foregoing and other changes in form and details may be made therein without departing from the spirit and scope of the invention.

What is claimed is:

1. An electronic package incorporating shielding against the emissions of electromagnetic interference (EMI); comprising:

a circuitized substrate of a dielectric organic material having opposite first and second surfaces, said first surface having a first portion and second portion;

an electrically-conductive ring-shaped continuous ground band being embedded in said substrate extending proximate the perimeter of said substrate and extending between said second portion of said first surface and said second surface;

a semiconductor chip being arranged on said first portion of said first surface;

a plurality of electrically conductive circuit members being positioned on said first portion of said first surface of said substrate each being electrically coupled to said semiconductor chip;

a lid member comprising an electrically conductive material being arranged on a surface of said semiconductor chip distal from the surface facing said substrate, said ground band being electrically connected with at least one electrically conductive member arranged on the second surface of said substrate, said lid member and at least one said electrically conductive circuit member on said first portion of the first surface of said substrate so as to impart an electromagnetic shield to said electronic package, a compliant and electrically conductive adhesive being arranged between said semiconductor chip and said lid member, and an electrically conductive stiffener being positioned on said second portion on the first surface of said substrate, said stiffener being electrically connected to at least one of said electrically conductive circuit members on said first portion on said first surface of said substrate, to at least one electrically conductive member on the second surface of said substrate through said electrically conductive ground band and in electrical connection with said lid member, an electrically conductive adhesive being arranged between said stiffener and said ground band and between said stiffener and said lid member so as to form said electrical connections between said elements.

2. An electronic package as claimed in claim 1, wherein said stiffener is located proximate the perimeter of said substrate so as to radially extend about said semiconductor chip.

3. An electronic package as claimed in claim 1, wherein said lid member comprises a thermally-conductive cap selected from the group of materials consisting of copper, aluminum, tin, chromium, silicon carbide, carbon, diamond, titanium, stainless steel, nickel, ceramic having an electrically-conductive coating, alloys of said materials, and composites of said materials.

4. An electronic package as claimed in claim 1, wherein said stiffener is constituted of a metallic composition selected from the group of materials consisting of copper, aluminum, tin, chromium, silicon carbide, carbon, diamond, titanium, stainless steel, nickel, ceramic having an electrically-conductive coating, alloys of said materials, and composites of said materials.

5. An electronic package as claimed in claim 1, wherein said electrically conductive circuit members on the first portion on the first surface of said substrate comprise solder balls.

6. An electronic package as claimed in claim 1, wherein said electrically conductive members on the second surface of said substrate comprise a ball grid array (BGA).

7. An electronic package as claimed in claim 1, wherein said substrate comprises a rigid dielectric ceramic material, said ground band being in electrical connection with said lid member through the interposition of an electrically conductive gasket positioned between the second portion on the first surface of said substrate and said lid member.

8. An electronic package as claimed in claim 7, wherein said lid member comprises a thermally-conductive cap selected from the group of materials consisting of copper, aluminum, tin, chromium, silicon carbide, carbon, diamond, titanium, stainless steel, nickel, ceramic having an electrically-conductive coating, alloys of said materials, and composites of said materials.

9. An electronic package as claimed in claim 8, wherein a compliant, thermally conductive adhesive is arranged between said semiconductor chip and said lid member.

10. An electronic package as claimed in claim 7, wherein said electrically conductive circuit member on the first portion on the first surface of said substrate comprise solder balls.

11. An electronic package as claimed in claim 7, wherein said electrically conductive member on the second surface of said substrate comprises a ball grid array (BGA).

12. An electronic package as claimed in claim 1, wherein said substrate comprises a rigid dielectric ceramic material, said lid member having an annular flange extending into proximity to the ground ring a the first surface of said substrate, said ground band being in electrical connection with said lid member through the interposition of an electrically conductive adhesive material positioned between the second aereal portion on the first surface of said substrate and a facing end surface on said annular depending flange of said lid member.

13. An electronic package as claimed in claim 12, wherein said lid member comprises a thermally-conductive cap selected from the group of materials consisting of copper, aluminum, tin, chromium, silicon carbide, carbon, diamond, titanium, stainless steel, nickel, ceramic having an electrically-conductive coating, alloys of said materials, and composites of said materials.

14. An electronic package as claimed in claim 13, wherein a compliant, thermally conductive adhesive is arranged between said semiconductor chip and said lid member.

15. An electronic package as claimed in claim 12, wherein said electrically conductive circuit members on the first portion on the first surface of said substrate comprise solder balls.

16. An electronic package as claimed in claim 12, wherein said electrical conductive members on the second surface of said substrate comprise a ball grid array (BGA).

17. An electronic package incorporating shielding against the effects of outgoing and incident electromagnetic interference (EMI); comprising:

a circuitized substrate of a dielectric organic material having opposite first and second surfaces, said first surface having a first portion and second portion;

an electrically-conductive ring-shaped continuous ground band being embedded in said substrate extending proximate the perimeter thereof and extending between said second portion of said first surface and said second surface;

a semiconductor chip being arranged on said first portion of said first surface;

a plurality of electrically conductive circuit members being positioned on said first portion of said first surface of said substrate each being electrically coupled to said semiconductor chip;

a lid member comprising an electrically conductive material being arranged on a surface of said semiconductor chip distal from the surface facing said substrate, said ground band being electrically connected with at least one electrically conductive member arranged on the second surface of said substrate, said lid member and at least one said electrically conductive circuit member on said first portion of the first surface of said substrate so as to impart an electromagnetic shield to said electronic package, a compliant and electrically conductive adhesive being arranged between said semiconductor chip and said lid member; and an electrically conductive stiffener being positioned on said second portion on the first surface of said substrate proximate the perimeter of said substrate, said stiffener being electrically connected to said lid member and to at least one of said electrically conductive circuit member on said first portion on the first surface of said substrate, and to at least one electrically conductive member on the second surface of said substrate through said electrically conductive ground band, and an electrically conductive adhesive being arranged between said stiffener and said ground band and between said stiffener and said lid member so as to form said electrical connections between said elements, said lid member and said stiffener being selected from the group of materials consisting of copper, aluminum, tin, chromium, silicon carbide, carbon, diamond, titanium, stainless steel, nickel, ceramic having an electrically-conductive coating, alloys of said materials, and composites of said materials.

18. An electronic package incorporating shielding against the effects of outgoing and incident electromagnetic interference (EMI); comprising:

a circuitized ceramic substrate having opposite first and second surfaces, said first surface having a first portion and second portion;

an electrically-conductive ring-shaped continuous ground band being embedded in said substrate extending proximate the perimeter thereof and extending between said second portion of said first surface and said second surface;

a semiconductor chip being arranged on said first portion of said first surface;

a plurality of electrically conductive circuit members being positioned on said first portion of said first surface of said substrate each being electrically coupled to said semiconductor chip;

and a lid member comprising a cap of an electrically and thermally-conductive material selected from the group of materials consisting of copper, aluminum, tin, chromium, silicon carbide, carbon, diamond, titanium, stainless steel, nickel, ceramic having an electrically-conductive coating, alloys of said materials, and composites of said materials, being arranged on a surface of said semiconductor chip distal from the surface facing said substrate, said ground band being electrically connected with at least one electrically conductive member arranged on the second surface of said substrate, said lid member and at least one said electrically conductive circuit member on said first portion of the first surface of said substrate so as to impart an electromagnetic shield to said electronic package; and an electrically conductive stiffener being positioned on said second portion on the first surface of said substrate proximate the perimeter of said substrate, said stiffener being electrically connected to said lid member and to at least one of said electrically conductive circuit member on said first portion on the first surface of said substrate, and to at least one electrically conductive member on the second surface of said substrate through said electrically conductive ground band.

19. An electronic package as claimed in claim 18, wherein said ground band is in electrical connection with said lid member through the interposition of an electrically conductive gasket positioned between the second portion on the first surface of said substrate and said lid member.

20. An electronic package as claimed in claim 18, wherein said lid member has an annular flange extending into proximity with the ground band the first surface of said substrate, said ground band being in electrical connection with said lid member through the interposition of an electrically conductive adhesive material positioned between the second portion on the first surface of said substrate and a facing end surface on said annular depending flange of said lid member.

21. A method of providing an electronic package incorporating shielding against the emissions and incidence of electromagnetic interference (EMI); comprising:

providing a circuitized substrate of a dielectric organic material having opposite first and second surfaces, said first surface having a first portion and second portion;

an electrically-conductive ring-shaped continuous ground band being embedded in said substrate extending proximate the perimeter of said substrate and extending between said second portion of said first surface and said second surface;

arranging a semiconductor chip being arranged on said first portion of said first surface;

positioning a plurality of electrically conductive circuit members on said first portion of said first surface of said substrate each being electrically coupled to said semiconductor chip;

and arranging a lid member comprising an electrically conductive material on a surface of said semiconductor chip distal from the surface facing said substrate, said ground band being electrically connected with at least one electrically conductive member arranged on the second surface of said substrate, said lid member and at least one said electrically conductive circuit member on said first portion of the first surface of said substrate so as to impart an electromagnetic shield to said electronic packages a compliant and electrically conductive adhesive being arranged between said semiconductor chip and said lid member, and positioning an electrically conductive stiffener on said second portion on the first surface of said substrate, said stiffener being electrically connected to at least one of said electrically conductive circuit members on said first portion on said first surface of said substrate, to at least one electrically conductive member on the second surface of said substrate through said electrically conductive ground band, and is in electrical connection with said lid member, an electrically conductive adhesive being arranged between said stiffener and said ground band and between said stiffener and said lid member so as to form said electrical connections between said elements.

22. A method as claimed in claim 21, wherein said stiffener is located proximate the perimeter of said substrate so as to radially extend about said semiconductor chip.

23. A method as claimed in claim 21, wherein said lid member comprises a thermally-conductive cap selected from the group of materials consisting of copper, aluminum, tin, chromium, silicon carbide, carbon, diamond, titanium, stainless steel, nickel, ceramic having an electrically-conductive coating, alloys of said materials, and composites of said materials.

24. A method as claimed in claim 21, wherein said stiffener is constituted of a material selected from the group of materials consisting of copper, aluminum, tin, chromium, silicon carbide, carbon, diamond, titanium, stainless steel, nickel, ceramic having an electrically-conductive coating, alloys of said materials, and composites of said materials.

25. A method as claimed in claim 21, wherein said electrically conductive circuit member on the first portion on the first surface of said substrate comprises solder balls.

26. A method as claimed in claim 21, wherein said electrical conductive member on the second surface of said substrate comprises a ball grid array (BGA).

27. A method as claimed in claim 21, wherein said substrate comprises a rigid dielectric ceramic material, said ground band being in electrical connection with said lid member through the interposition of an electrically conductive gasket positioned between the second portion on said surface of said substrate and said lid member.

28. A method as claimed in claim 21, wherein said substrate comprises a rigid dielectric ceramic material, said lid member having an annular flange extending into proximity to the ground band at the first surface of said substrate, said ground band being in electrical connection with said lid member through the interposition of an electrically conductive adhesive material positioned between the second portion on said first surface of said substrate and a facing end surface on said annular depending flange of said lid member.

* * * * *